(12) United States Patent
Lu et al.

(10) Patent No.: US 9,871,487 B2
(45) Date of Patent: Jan. 16, 2018

(54) HARMONIC REJECTION TRANSLATIONAL FILTER

(71) Applicant: MEDIATEK INC., Hsin-Chu (TW)

(72) Inventors: Ying-Tsang Lu, Hsinchu County (TW); Chih-Ming Hung, Mckinney, TX (US); Meng-Chang Lee, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/125,148

(22) PCT Filed: Mar. 13, 2015

(86) PCT No.: PCT/CN2015/074229
§ 371 (c)(1),
(2) Date: Sep. 10, 2016

(87) PCT Pub. No.: WO2015/135507
PCT Pub. Date: Sep. 17, 2015

(65) Prior Publication Data
US 2016/0380593 A1 Dec. 29, 2016

Related U.S. Application Data

(60) Provisional application No. 61/952,559, filed on Mar. 13, 2014.

(51) Int. Cl.
*H03K 5/00* (2006.01)
*H03D 7/04* (2006.01)
(Continued)

(52) U.S. Cl.
CPC ......... *H03D 7/1483* (2013.01); *H03D 7/1441* (2013.01); *H03D 7/1458* (2013.01);
(Continued)

(58) Field of Classification Search
CPC . H03D 7/1483; H03D 7/1441; H03H 11/0405
(Continued)

(56) References Cited

U.S. PATENT DOCUMENTS 7,409,245 B1 * 8/2008 Larson ............... H01Q 1/273
343/860
8,165,538 B2 4/2012 Pullela
(Continued)

FOREIGN PATENT DOCUMENTS

CN 101373950 A 2/2009
CN 101772886 A 7/2010
(Continued)

OTHER PUBLICATIONS

"International Search Report" dated May 29, 2015 for International application No. PCT/CN2015/074229, International filing date:Mar. 13, 2015.
(Continued)

*Primary Examiner* — Dinh T Le
(74) *Attorney, Agent, or Firm* — Winston Hsu

(57) ABSTRACT

A harmonic translational filter includes a first path, a second path and a signal combiner. The first path has a first translational filter that is driven by a plurality of first oscillation signals, and is arranged to generate a first output signal according to an input signal. The second path has a second translation filter that is driven by a plurality of second oscillation signals that are different from the first oscillation signals in phase. The second path is coupled to the first path and arranged to generate a second output signal according to the input signal. The signal combiner is coupled to the first path and the second path, and arranged to combine the first output signal and the second output signal to generate a filtered signal.

14 Claims, 12 Drawing Sheets

(51) Int. Cl.
*H03D 7/14* (2006.01)
*H03H 11/04* (2006.01)

(52) U.S. Cl.
CPC ....... *H03D 7/1466* (2013.01); *H03H 11/0405* (2013.01); *H03H 11/0466* (2013.01); *H03D 2200/0086* (2013.01)

(58) Field of Classification Search
USPC .......... 327/551–559, 355–357; 455/323, 326
See application file for complete search history.

(56) References Cited

U.S. PATENT DOCUMENTS

| | | | | |
|---|---|---|---|---|
| 8,280,333 | B2* | 10/2012 | Van Sinderen | H03D 7/1441 455/285 |
| 8,441,470 | B2* | 5/2013 | Hibi | G09G 3/3611 324/403 |
| 8,552,790 | B2 | 10/2013 | Zhang | |
| 8,606,210 | B2 | 12/2013 | Ru | |
| 8,670,739 | B1* | 3/2014 | Murphy | H04B 1/1027 375/350 |
| 9,071,325 | B2* | 6/2015 | Pullela | H04B 1/1638 |
| 2012/0063555 | A1* | 3/2012 | Pullela | H04B 1/1638 375/350 |
| 2012/0238232 | A1 | 9/2012 | Murphy | |

FOREIGN PATENT DOCUMENTS

| | | |
|---|---|---|
| CN | 102106076 A | 6/2011 |
| CN | 102308472 A | 1/2012 |
| CN | 102347731 A | 2/2012 |
| CN | 102428653 A | 4/2012 |
| CN | 102522952 A | 6/2012 |

OTHER PUBLICATIONS

David Murphy et al., A Blocker-Tolerant, Noise-Cancelling Receiver Suitable for Wideband Wireless Applications, IEEE Journal of Solid-State Circuits, vol. 47, No. 12, Dec. 2012, pp. 2943-2963, XP011485437, IEEE.

David Murphy et al., "A Blocker-Tolerant, Noise-Cancelling Receiver Suitable for Wideband Wireless Applications", IEEE Journal of Solid-State Circuits, vol. 47, No. 12, Dec. 3, 2012, pp. 2943-2962.

* cited by examiner (Non-overlapped)

(Overlapped)

HARMONIC REJECTION TRANSLATIONAL FILTER

CROSS REFERENCE TO RELATED APPLICATIONS

This application claims the benefit of U.S. provisional application No. 61/952,559, filed on Mar. 13, 2014 and incorporated herein by reference.

TECHNICAL FIELD

The present invention relates generally to a filter, and more particularly, to a harmonic-rejection filter that includes multiple paths, each having a translational filter.

BACKGROUND

For wideband receivers, such as multi-standard software defined radios (SDR) and multi-standard TV receivers, they usually suffer from harmonic-mixing problem if frequency translation exists, no matter single-conversion (up-conversion or down-conversion), or dual-conversion. The harmonic-mixing problem is basically caused by local oscillator (LO) harmonics and further leads unwanted signals, interferers, or blockers to be translated into the desired channel, along with the desired signal, thus degrading the signal-to-noise ratio.

For example, in a down-conversion case, the mixer is used for translating a signal from a radio frequency $f_{RF}$ to an intermediate frequency $f_{IF}$ based on the multiplication of the input signal at radio frequency $f_{RF}$ with a local oscillation signal at a local oscillation frequency $f_{LO}$. Since most of the local oscillation signal is in a form of a square-wave type, it includes not only fundamental component at the local oscillation frequency $f_{LO}$, but also components at harmonics of $f_{LO}$. Hence, the multiplication will introduce additional spectral components of the input signal that are not at the desired radio frequency $f_{RF}$, into the intermediate frequency $f_{IF}$.

Conventional wideband receivers usually demand a high-Q band-pass tracking filter in front of the mixer or LNA to reject all unwanted signals, interferers or blocks, so as to alleviate linearity requirements and prevent from being converted to the desired channel due to harmonic-mixing. Furthermore, the Harmonic-Rejection Mixer (HRM) might be necessary for more stringent standard requirements to enhance $3^{rd}$-order and $5^{th}$-order harmonic-rejection ratio. In addition, modern CMOS IC design desires to integrate tracking filter on a chip, instead of bulky and high-cost external components, for small size, low cost, and low power consumption considerations. The translational filter has the advantage of high-Q, low-cost, and precisely tunable center frequency and thus can be a good candidate for such an on-chip tracking filter. However, there still exists harmonic-mixing problem for translational filter used in wideband system since it performs frequency translation as well. Moreover, conventional harmonic-rejection techniques can be applied to mixer only (down-conversion or up-conversion one time), but not suitable for translational filter which can be regarded as to perform down-conversion and up-conversion simultaneously. Therefore, there is a need to provide a novel technique to realize a translational filter with the ability of harmonic-rejection for wideband applications.

SUMMARY

With the aforementioned in mind, one objective of the present invention is to provide a harmonic-rejection translational filter that can achieve high harmonic-rejection ratio caused by harmonics of local oscillation signal, while preserve all advantages of translational filter. By using the present invention, the translational filer can be employed in wideband system and exhibit good performance.

According to one aspect of the present invention, a harmonic-rejection translational filter is provided. The harmonic-rejection translational filter comprises: a first path, a second path and a signal combiner. The first path has a first translational filter that is driven by a plurality of first oscillation signals, and is arranged to generate a first output signal according to an input signal. The second path has a second translational filter that is driven by a plurality of second oscillation signals that are different from the first oscillation signals in phase. The second path is coupled to the first path and arranged to generate a second output signal according to the input signal. The signal combiner is coupled to the first path and the second path, and arranged to combine the first output signal and the second output signal to generate a filtered signal with harmonics cancellation.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following descriptions and claims to refer to particular system components. As one skilled in the art will appreciate, manufacturers may refer to a component by different names. This document does not intend to distinguish between components that differ in name but not differ in functionality. In the following discussion and in the claims, the terms "include", "including", "comprise", and "comprising" are used in an openended fashion, and thus should be interpreted to mean "including, but not limited to . . . " The terms "couple" and "coupled" are intended to mean either an indirect or a direct electrical connection. Thus, if a first device couples to a second device, that connection may be through a direct electrical connection, or through an indirect electrical connection via other devices and connections.

To achieve a filter having properties of high-Q and precisely tunable center frequency, the present invention utilizes multiple translational filters to implement a harmonic-rejection filter. These translational filters form multiple signal processing paths with respect to the input signal, respectively, and results of different paths will be combined to obtain a filtered signal. Each of the signal processing paths will provide a specific frequency response for filtering the input signal, and harmonic-mixing products generated in different paths will be substantially reduced.

Figure 1:
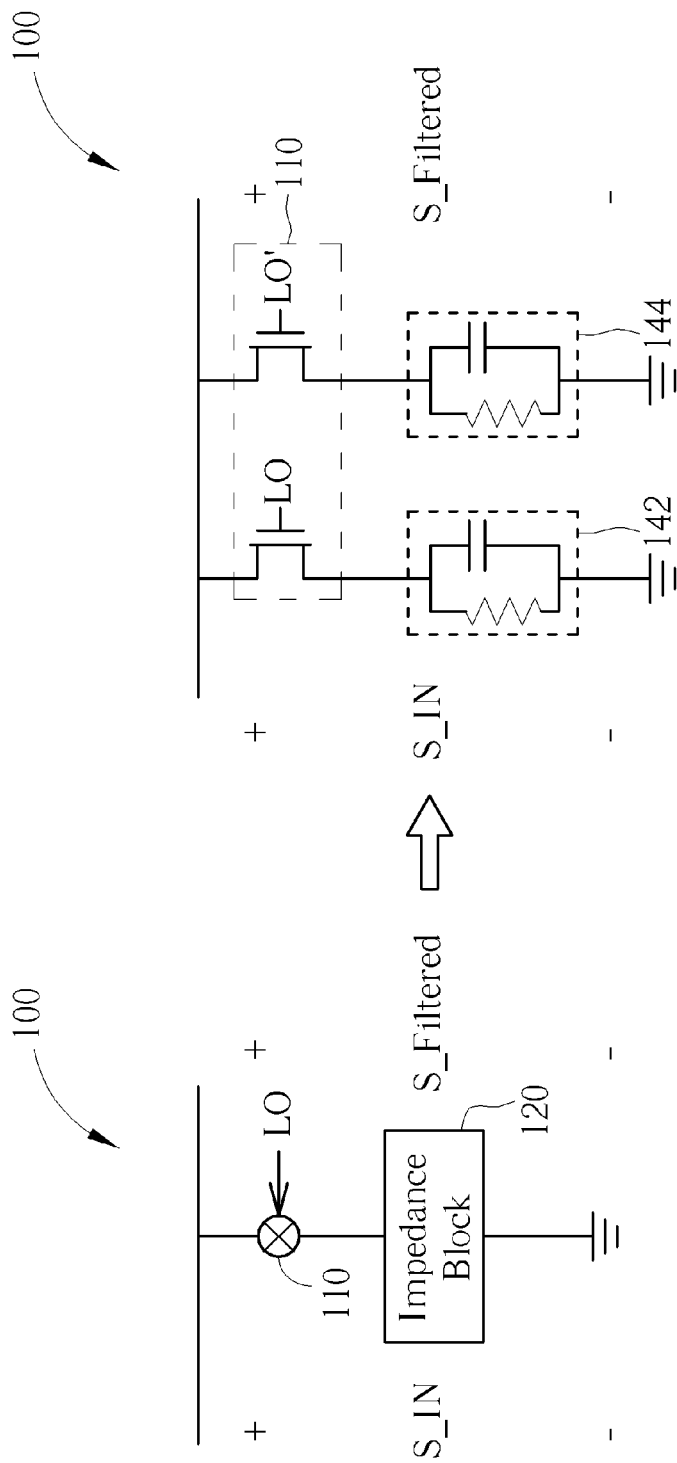
FIG. 1 illustrates a translational filter according to one embodiment of the present invention.

Translational Filter:

Please refer to FIG. 1, which illustrates a block diagram of a translational filter used in a harmonic-rejection filter of the present invention. As illustrated by the figure, a translational filter 100 includes a switching mixer 110 and an impedance block 120. The switching mixer 110 mixes an input signal S_IN with a local oscillation signal LO. The impedance block 120 provides specific baseband impedance in response to all mixing products after mixing switches. This baseband impedance will be translated to input and leads to a symmetric filter response near the LO frequency $f_{LO}$. A filtered signal S_Filtered is therefore generated at the terminal that the input signal S_IN is sent to. As shown on the right hand side of FIG. 1, the switching mixer 110 actually includes MOS switches that are driven by multiple phases of local oscillation signal LO. More specifically, the switching mixer 110 in this illustration includes MOS switches that are respectively driven by local oscillation signals LO and LO' with different phases. It should be noted that a conventional switching mixer is usually used for frequency conversion (down or up conversion), and thus its input and output ports are assigned at different nodes of switching mixer (one for RF port and the other for IF port), i.e. switching mixer is connected in series type. While the purpose of the translational filter is for filtering, it is usually connected at the signal node which needs to be filtered, i.e. its switching mixer is connected in parallel type. In fact, if take signal from RF port of passive switching mixer, it could be have a frequency response like translational loop filter depending on its impedance at IF port.

Figure 2:
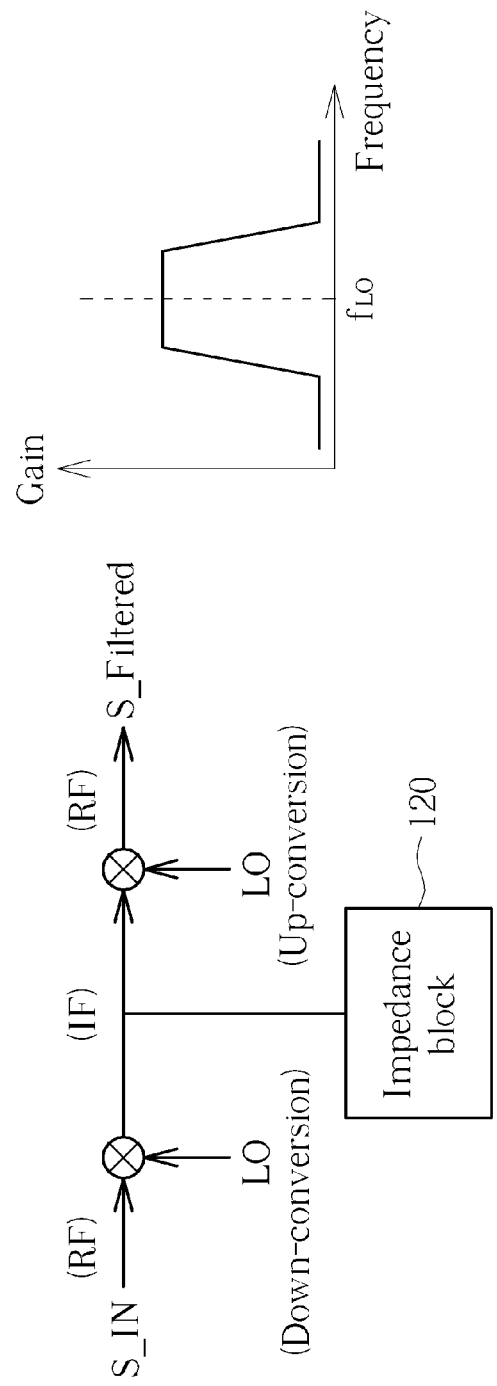
FIG. 2 illustrates an equivalent model of the translational filter as shown in FIG. 1.

An equivalent model of the translational filer 100 is illustrated in FIG. 2. The principles and operations of the translational filter 100 can be considered as firstly performing a down-conversion operation on the input signal S_IN to translate the input signal S_IN to intermediate frequency accompanied a frequency response in accordance to the baseband impedance block 120. Then, an up-conversion operation is performed on a result of down-conversion to generate the filtered signal S_Filtered. With the aid of the impedance provided by the impedance block 120, the translational filter 100 can provide a frequency response over a specific range of frequencies. Assuming that the impedance block 120 (or impedance block 142(144)) is comprised of a capacitor in parallel with a resistor, the translational filter 100 is substantially a band-pass filter, and has a frequency response as illustrated on the right hand side of FIG. 2 (having a center frequency at $f_{LO}$).

Please note that according to various embodiments of the present invention, the switching mixer 110 could be replaced with any other types of mixers, while the impedance block 120 (i.e., impedance block 142(144)) could include any possible combination of active and/or passive components, such as amplifiers, transconductors, inductors, capacitors, resistors (e.g. C, RC, LC, or RLC). Depending on the components included in the impedance block 120, the translational filter 100 could be a band-stop filter, a band-pass filter, an all-pass filter or a combination of different filtering shapes in both real and complex domains. For example, when the impedance block 120 includes an inductor in parallel with a capacitor, the impedance block 120 could have a band-pass frequency response and leads to a double pass-band frequency response on translational filter. In addition, using an active component, such as an amplifier or transconductor, to combine with capacitors and resistors can also realize an active inductive component to achieve the same effect.

Figure 3A:
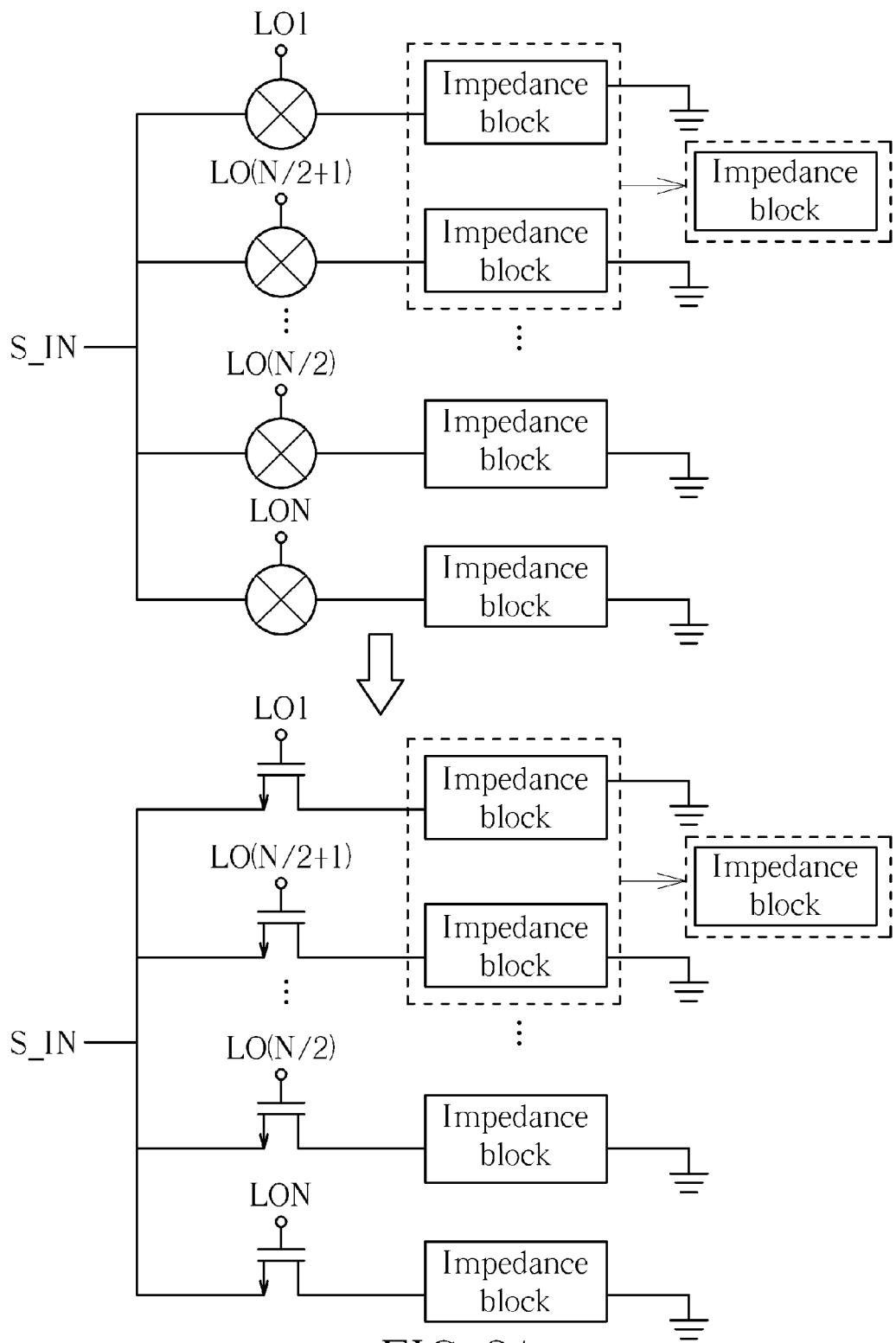
FIG. 3A and FIG. 3B illustrates an extended architecture of the translational loop filter according to one embodiment of the present invention.

Furthermore, the translational filter 100 can be extended to a generalized N-Path filter as shown by FIG. 3A, which contains N identical filter branches and each branch includes a switching mixer and an impedance block 142. Each branch is driven by one of N-phase LO signals LO1-LON, these LO signals LO1-LON are mutually different in phase. Each of switching mixer is comprised of multiple MOS or other-type transistors. A switching mixer could be coupled to the ground through an impedance block. Alternatively, two switching mixers that are driven by complementary-phases LO signals could share one impedance block without being coupled to the ground.

Figure 3B:
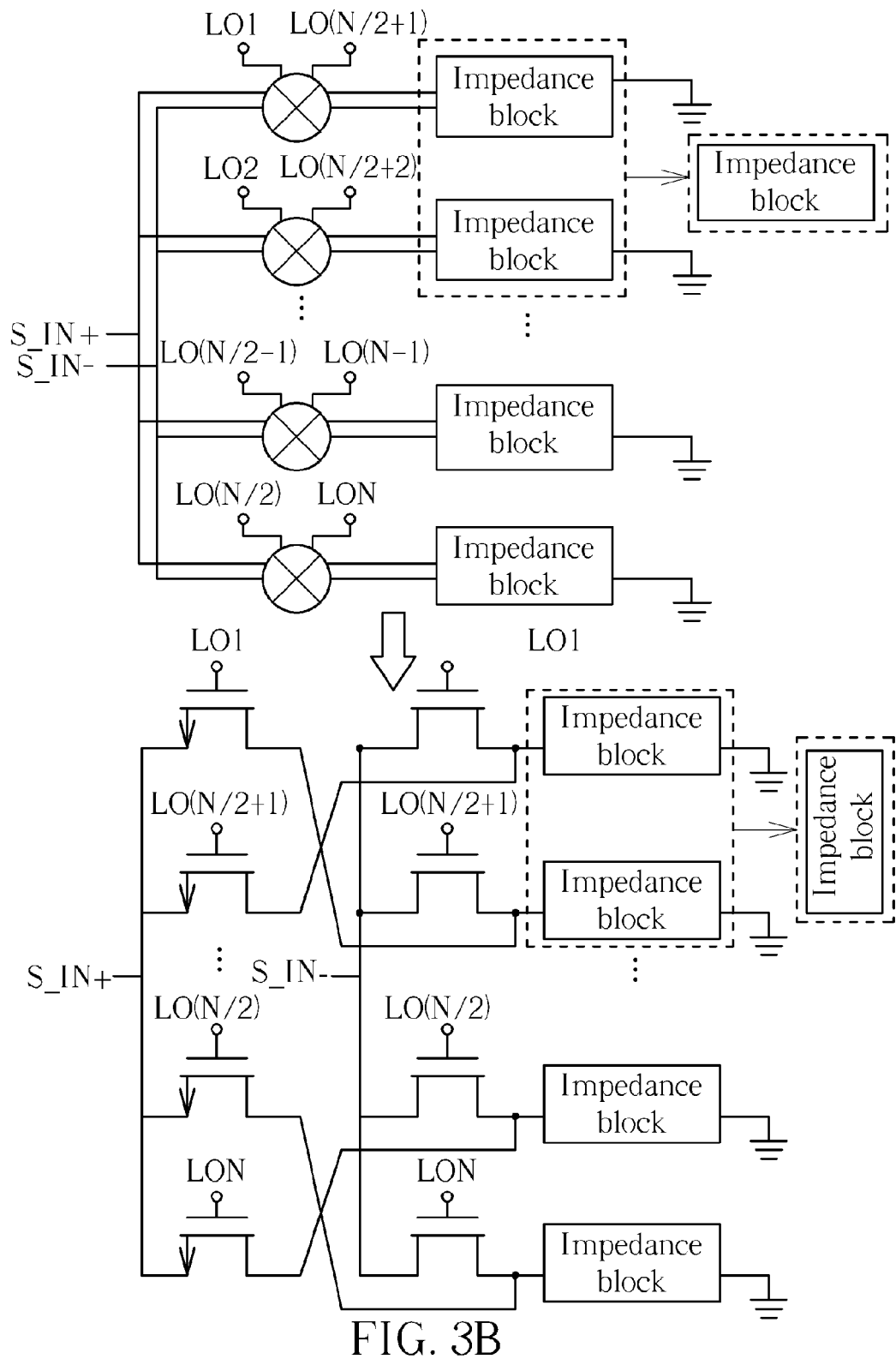

In addition, an N-path filter can be in the form of either single-ended or differential configuration. FIG. 3B illustrates a differential form of an N-path filter according to one embodiment of the present invention. The differential N-path filter includes two parts. One part is for positive component S_IN+ of the input signal S_IN, while the other part is for negative component S_IN− of the input signal S_IN. One of the filter branches of the part for positive component share an impedance block with one of the filter branches of the part for negative component, and they are interconnected. Similarly, a switching mixer could be coupled to the ground through an impedance block. Alternatively, two switching mixers that are driven by complementary-phases LO signals could share one impedance block without being coupled to the ground.

Figure 4:
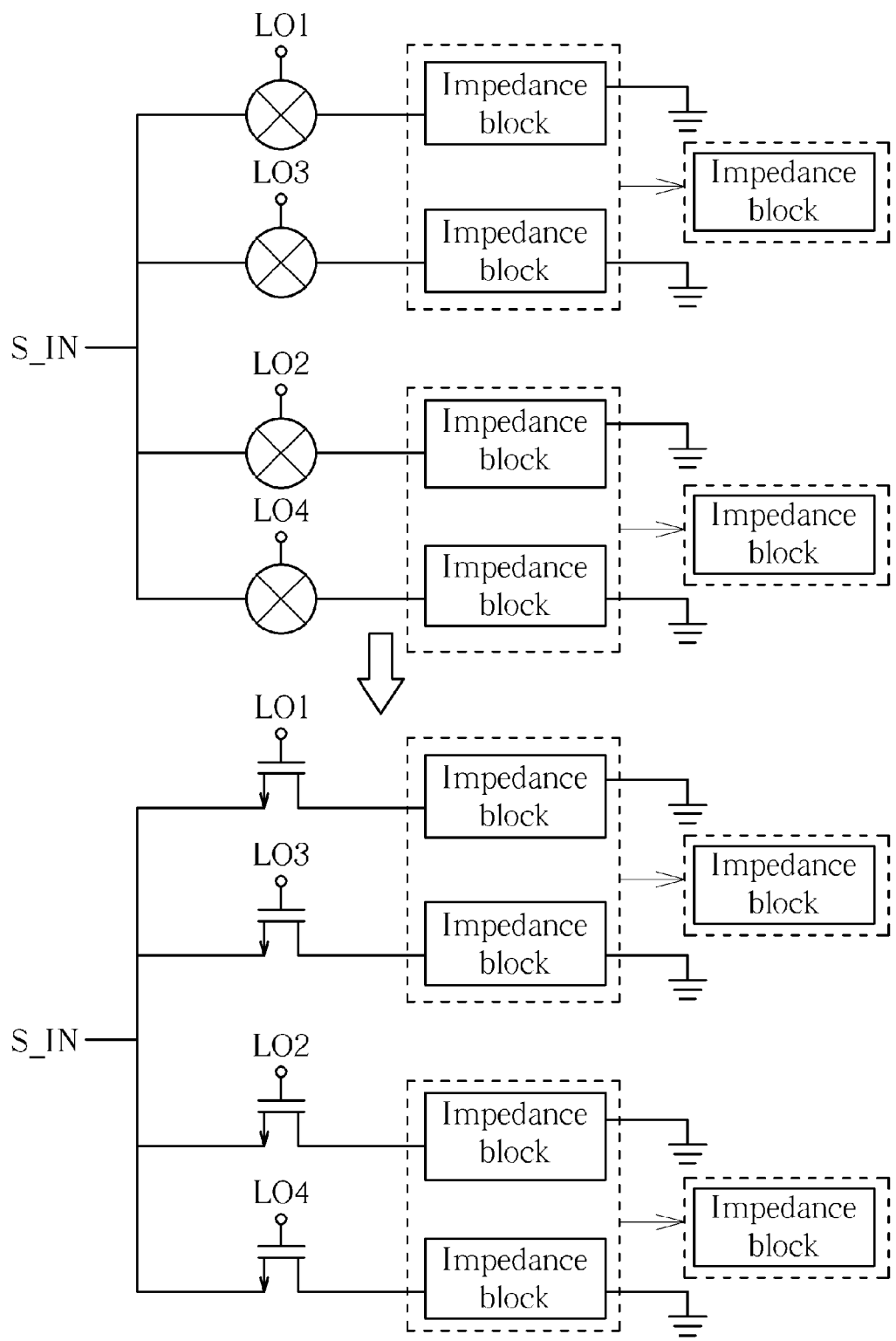
FIG. 4 illustrates filter branches in the translational filter according to one embodiment of the present invention.

For most of applications, a translational filter 200 is implemented by at least four filter branches 210-240 as illustrated in FIG. 4 for either single-ended or differential translation filter configurations. For single-ended cases, the number of branches may be reduced by half. The four branches 210, 220, 230 and 240 are driven by four-phase local oscillation signals such as 0, 90, 180, and 270 degree for LO1, LO2, LO3, and LO4, respectively to prevent degradation of the desired signal resulting from signal and noise at the image location on the frequency spectrum. The translational filter 200 provides a frequency response based on each of the impedance blocks to filter the input signal S_IN. For the branches having differential relations, such as branches 210 and 230, the reference ground of the impedance blocks can be merged to form one differential impedance block. For example, two single-ended capacitors, one in 210 and the other in 230, can be combined as one differential capacitor at quarter size. In addition, a switching mixer could be coupled to the ground through an impedance block. Alternatively, two switching mixers that are driven by complementary-phase LO signals (e.g. switching mixer driven by LO1 and LO3, LO2 and LO4) could share one impedance block without being coupled to the ground.

Figure 5:
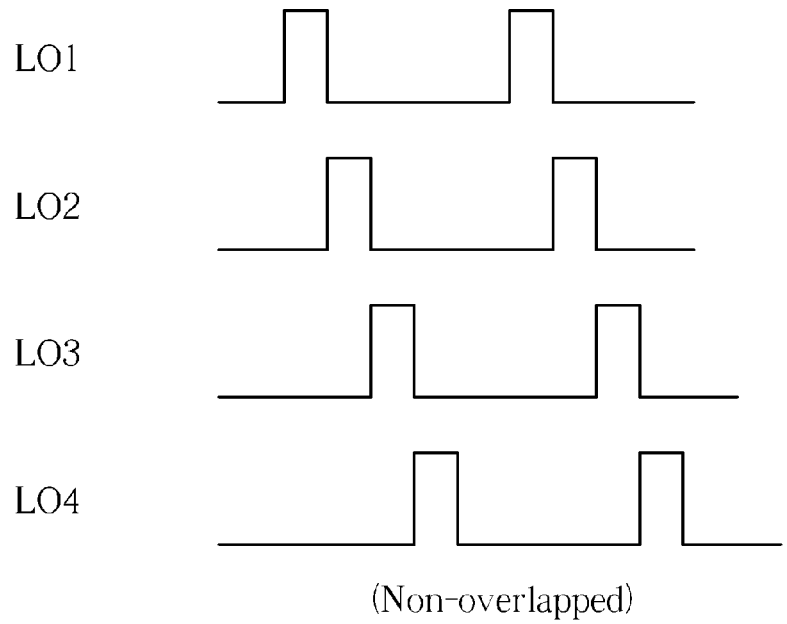
FIG. 5 illustrates timing charts of the local oscillation signals that is used to drive switching mixer of filter branches.
Figure 5:
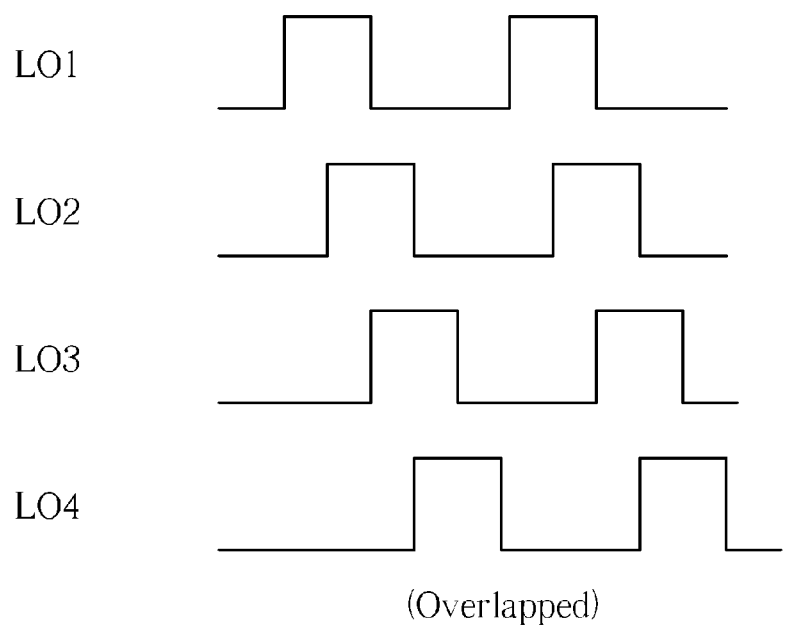

The N-Phase local oscillation signals LO1-LON could be either non-overlapped or overlapped. Typically, duty-cycle of N-Phase LO is designed to be (100/N) %, however, some specific duty-cycle might be taken for special design requirements, such as harmonic rejection. According to different embodiments of the present invention, timing charts of the oscillation signals LO1-LO4 (in case where N is equal to 4) are illustrated in FIG. 5. That is, the local oscillation signals LO1-LO4 could be about either 25% duty-cycle or 50% duty-cycle, and could be overlapped or non-overlapped.

Harmonic-Rejection Translational Filter:

As mentioned above, the translational filter has advantages of High-Q and precisely tunable center frequency, but it suffers from harmonic-mixing problem for wideband applications. Just as in conventional mixer, all undesired signals, interferers, or blockers near harmonics of local oscillation signal at multiples of LO frequency $f_{LO}$ will introduce the undesired harmonic-mixing products to the IF port of switching mixer during the multiplication with harmonics of local oscillation signal, and meanwhile these undesired harmonic-mixing products will be up-converted back to the input port of translational loop filter via the multiplication with the fundamental local oscillation signal. In order to remove the harmonic-mixing products, the present invention utilizes a harmonic-rejection path to reduce/cancel the harmonic-mixing products generated in a main path. As a result, only mixing result corresponding to the fundamental frequency will be reserved.

Figure 6:
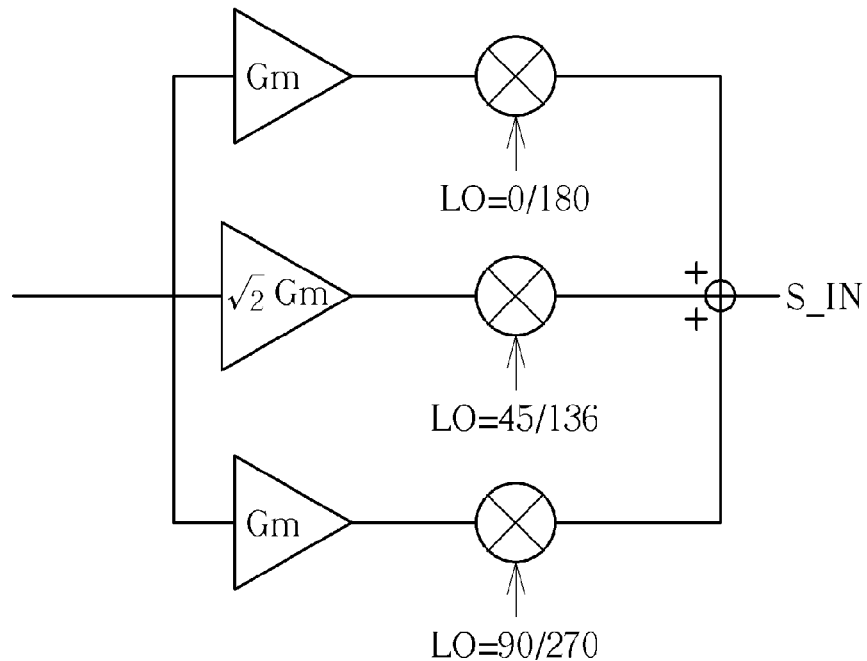
FIG. 6 illustrates a block diagram and phasor plot of the conventional Harmonic-Rejection Mixer.
Figure 6:
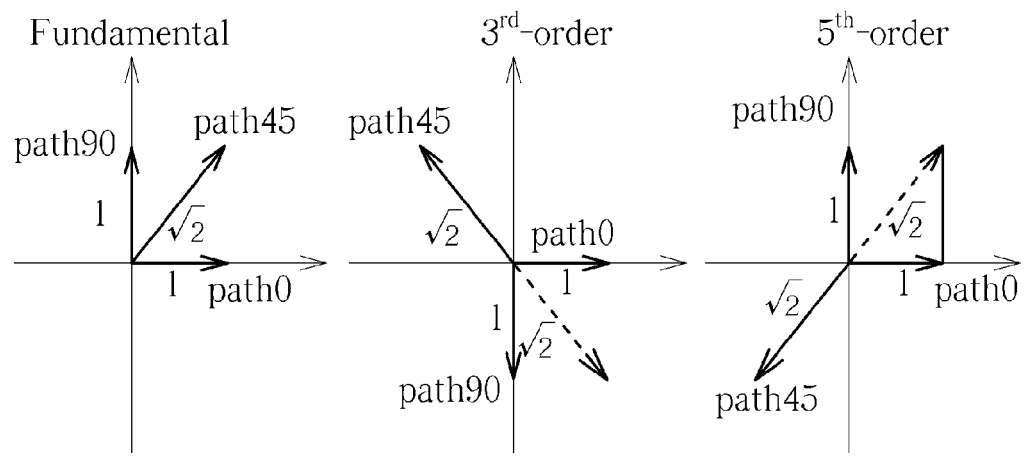

FIG. 6 illustrates a block diagram of a conventional Harmonic-Rejection Mixer (HRM). In addition to in-phase and quadrature-phase paths, another harmonic-rejection path is introduced. For $3^{rd}$-order or $5^{th}$-order harmonic-mixing products, the sum of in-phase and quadrature-phase paths has the square-root of twice in magnitude and negative/positive 45 degree in phase as the dotted line shown on the bottom side of FIG. 6. To take another path driven by 45 degree local oscillation signal and magnified by the square-root of two can ideally cancel out $3^{rd}$-order and $5^{th}$-order harmonic-mixing products. In reality, the rejection-ratio strongly depends on gain and phase mismatch between three paths. However, the square-root of twice can't be precisely realized in CMOS IC, and thus it usually dominates the gain mismatch factor. Consequently, high harmonic-rejection ratio can't be achieved without mismatch calibration in such a configuration. It should be reminded again that this technique can't be applied for translational loop directly.

Figure 7A:
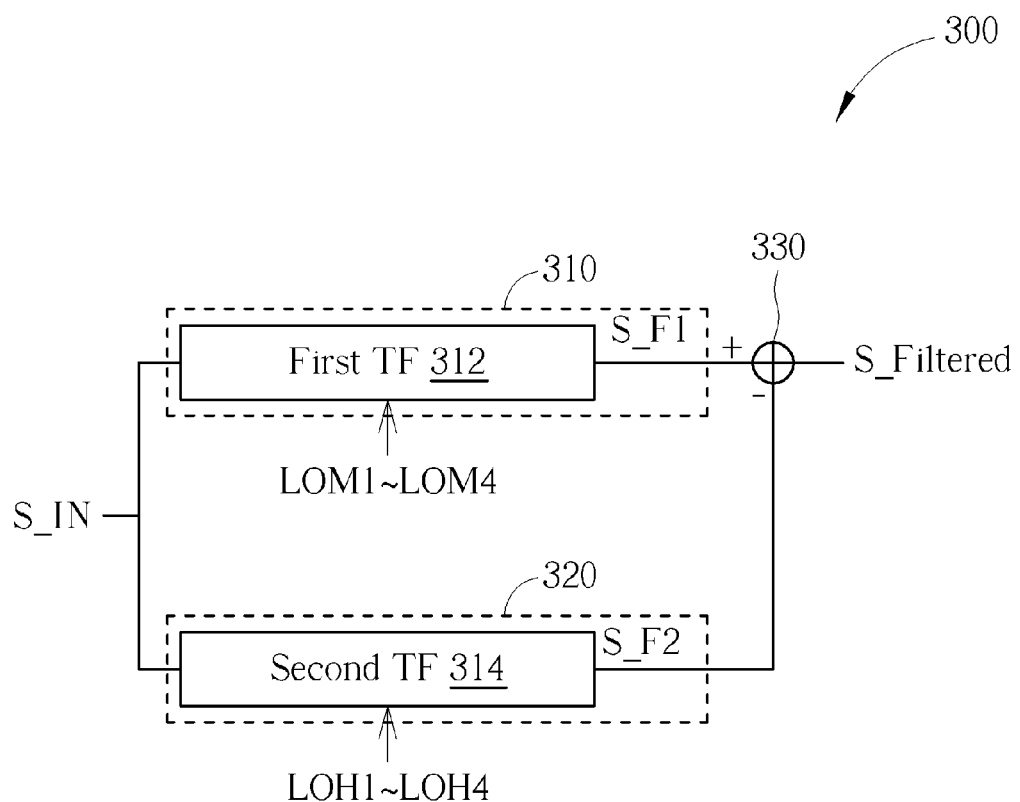
FIGS. 7A and 7B illustrate a block diagram and detailed implementation of an 8-phase harmonic-rejection translational filter including one harmonic-rejection path according to an embodiment of the present invention.

FIG. 7A illustrates a schematic diagram of a harmonic-rejection translation filter according to one embodiment of the present invention. As shown in FIG. 7A, a harmonic-rejection translation filter 300 includes a main path 310 and a harmonic-rejection path 320. The main path 310 includes a first translation filter 312 while the harmonic-rejection path 320 includes a second translation filter 314. The first translation filter 312 is driven by local oscillation signals LOM1-LOM4, having the frequency at $F_{LO}$ and phases P1-P4. The second translation filter 314 is driven by local oscillation signals LOH1-LOH4, having the frequency at $F_{LO}$ and phases P5-P8. The phases P1-P4 of the local oscillation signals LOM1-LOM4 are mutually different from the phases P5-P8 of the local oscillation signals LOH1-LH4. A signal combiner 330 combines a first output signal S_F1 from the main path 310 with a second output signal S_F2 from the harmonic-rejection path 320, thereby generating a filtered signal S_Filtered.

Figure 7B:
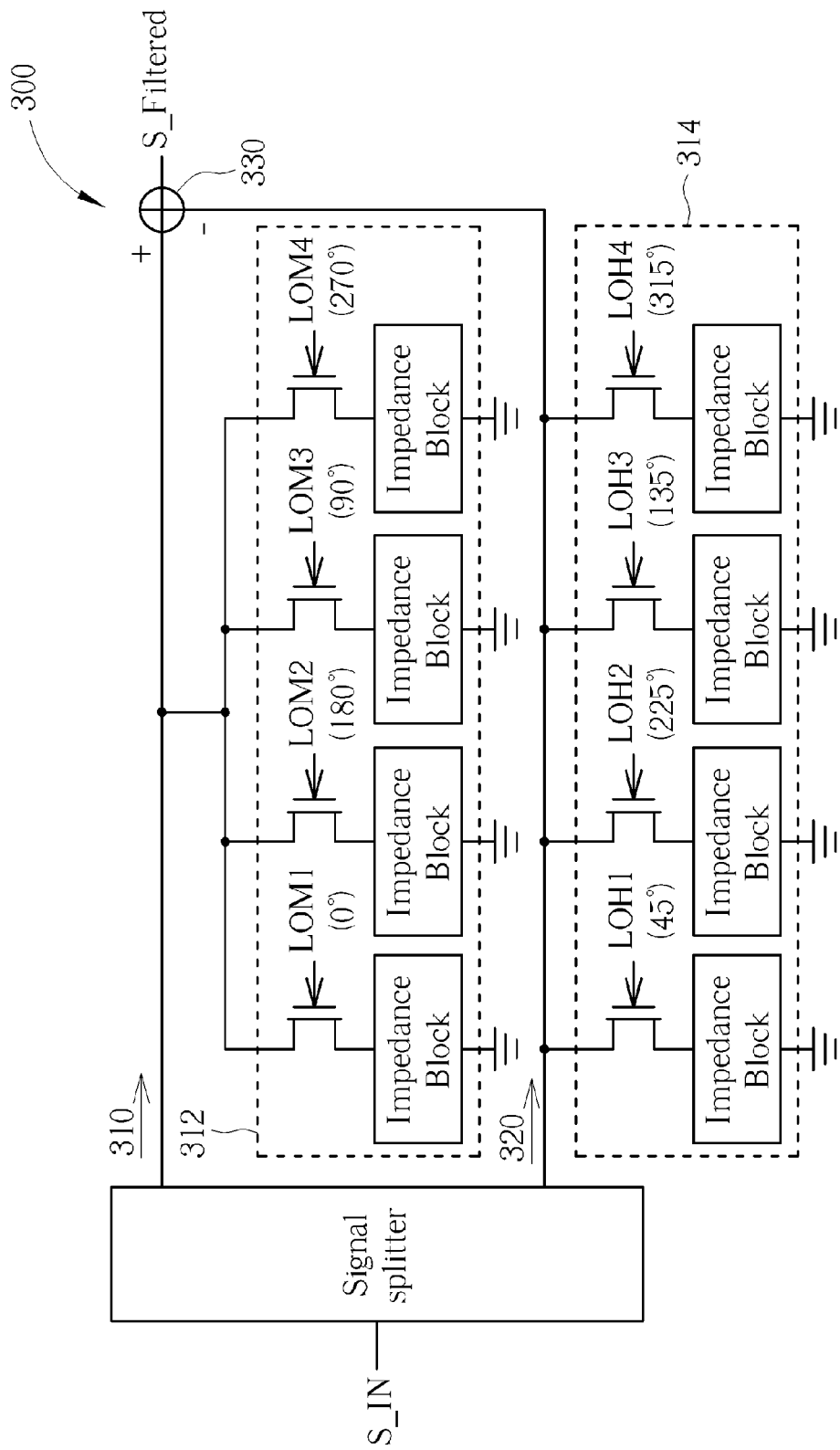

FIG. 7B illustrates the harmonic-rejection translation filter 300 in further details. The first translation filter 312 may include identical four filter branches and the filter branches in the first translation filter 312 are driven by the corresponding local oscillation signals LOM1-LOM4 at phases P1-P4 (0, 180, 90 and 270 degree), respectively. As these four filter branches are driven by quadrature-phase local oscillation signals, signal degradation by image can be also prevented. The first translation filter 312 provides a frequency response depending on components included in each of the impedance blocks to the input signal S_IN. The second translation filter 314 is identical to the first translation filter 312 in the number of the filter branches. And each filter branch of the second translation filter 314 is also identical to the filter branch in the first translation filter 312. The filter branches in the second translation filter 314 are driven by the local oscillation signals LOH1-LOH4 that has phases P5-P8 different to phases P1-P4 of the local oscillation signals LOM1-LOM4. In particular, the local oscillation signals LOH1-LOH4 may have the phases P5-P8 at 45, 225, 135 and 315 degree. With such LO phase arrangement, the harmonic-mixing products which will fall into desired channel due to the $3^{rd}$ and $5^{th}$ LO harmonics generated in the main path 310 could be reduced by the harmonic-rejection path 320.

Figure 8:
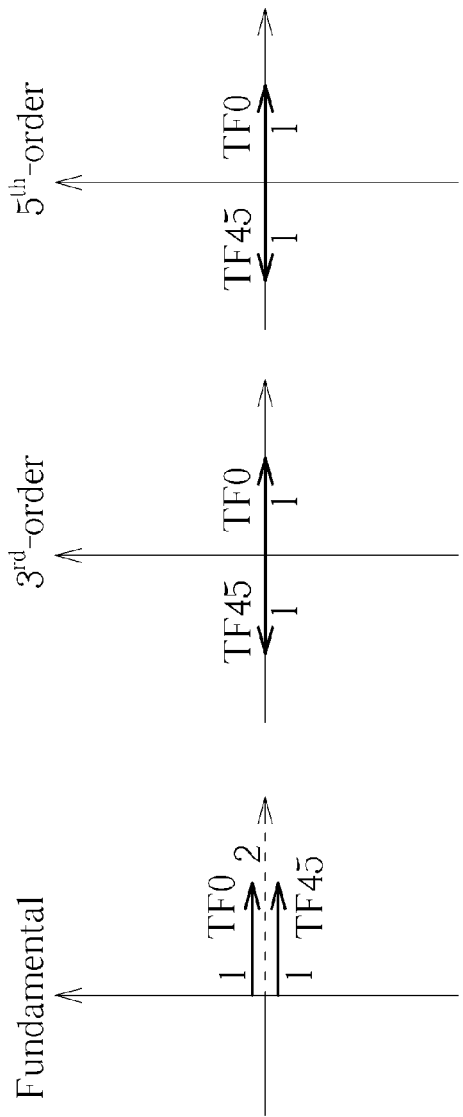
FIG. 8 illustrates the phasor plot of the present invention shown in FIG. 7.

As mentioned earlier, since translation filter can be modeled as performing down-conversion and then up-conversion, all equations with respect to different harmonic-mixing process can be easily derived based on this model. FIG. 8 illustrates equations and corresponding phasor plots of each path with respect to fundamental, $3^{rd}$-order, and $5^{th}$-order harmonic-mixing products. Different to conventional mixer, only in-phase and out-of-phase mixing products will be remained at the output of either main path or harmonic-rejection path due to dual-conversion in a translational filter. (Quadrature-phase image components are ideally cancelled by quadrature-phase of local oscillation signals in each path itself.) In addition, the term of square root of two no longer exists in such a harmonic-rejection translational filer. As a result, the tough challenge of generating a precise square-root of twice path in a conventional harmonic-rejection mixer, which typically limits the achievable harmonic-rejection, is also no longer needed. Since two paths of harmonic-rejection translational filer are identical (only driven by different LO phase) and harmonic-rejection is determined solely by mismatch between each path, the present invention can achieve outstanding harmonic-rejection even without any mismatch calibration because there are very few sources of mismatch from the nrarly identical paths. In addition, as circuitry of each translational filter does not need to be changed in the harmonic-rejection filter, all advantages of translational filter, such as High-Q, and precisely controllable center frequency can be preserved.

That is, both the first translation filter 312 of the main path 310 and the second translation filter 314 of the harmonic-rejection path 320 can provide frequency filtering effect to the input signal S_IN, while the second translation filter 314 of the harmonic-rejection path 320 can further provide harmonic-rejection effect to cancel interferences caused by harmonics of the local oscillation signal. Hence, a High-Q and harmonic-rejection filter can be implemented. According to various embodiments of the present invention, the first translation filter 312 and the second translation filter 314 may include filter branches of different quantities, For example, each of the first translation filter 312 and the second translation filter 314 may have two, eight or other number of filter branches.

Harmonic-Rejection Translation Filter for High-Order Harmonics:

In the embodiments illustrated by FIG. 7A-7B, the harmonic-rejection translational filter 300 can reject $3^{rd}$-order and $5^{th}$-order harmonic-mixing products by means of driving two identical translation filters with the local oscillation signals with eight different phases and combining their respective outputs. However, this may not be enough to reject only $3^{rd}$-order and $5^{th}$-order harmonic-mixing products for some systems, higher-order odd harmonics rejection might be mandatory. Therefore, the present invention further provides a high-order harmonic-rejection translational filter having more translation filters that are driven by the local oscillation signals with more different phases.

Figure 9:
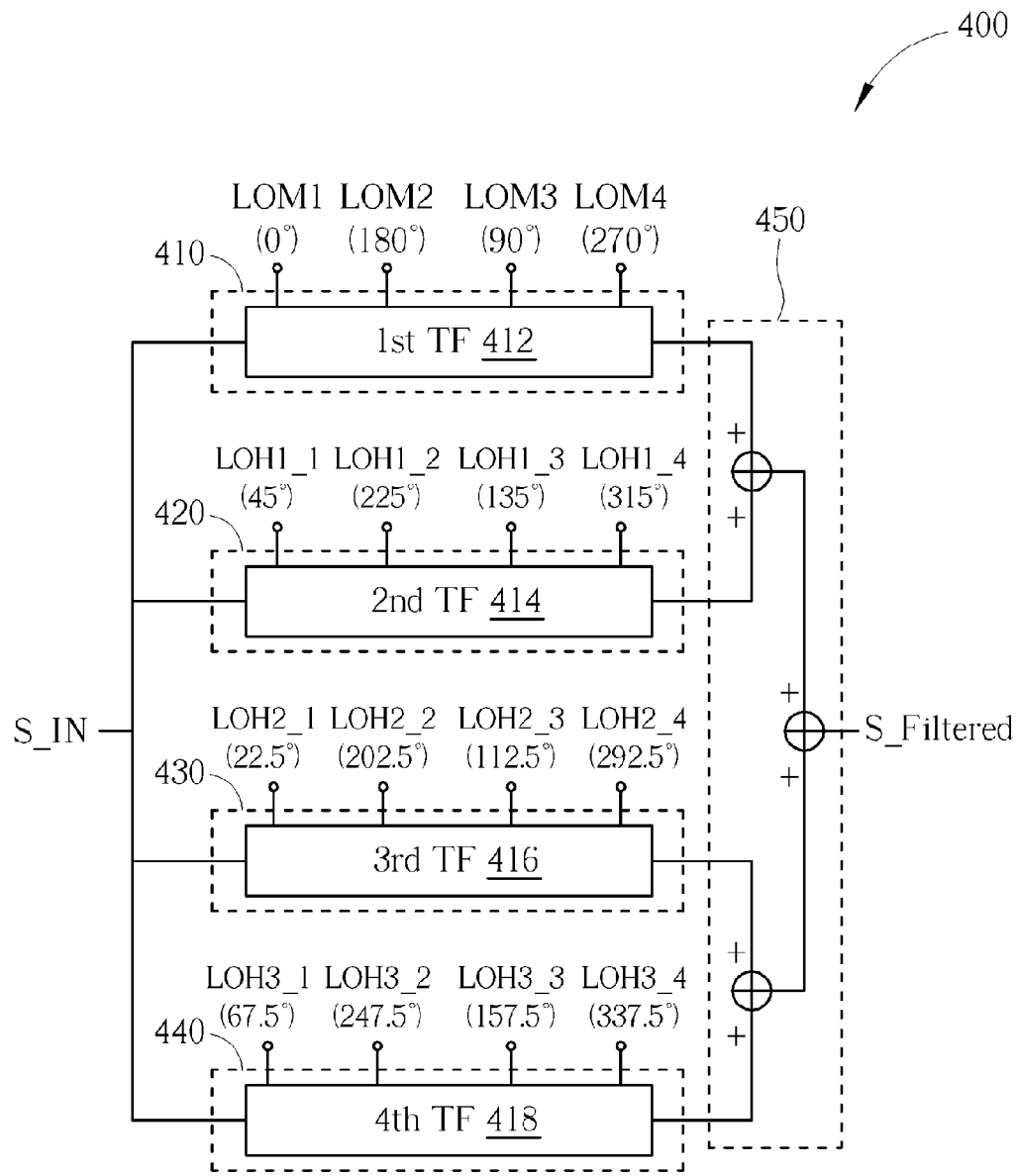
FIG. 9 illustrates a block diagram of a 16-phase harmonic-rejection translational filter including three harmonic-rejection paths according to an embodiment of the present invention.

Please refer to FIG. 9, which illustrates a harmonic-rejection translational filter 400 has the capability of rejecting $3^{rd}$-order, $5^{th}$-order, $7^{th}$-order and $9^{th}$-order harmonic-mixing products. In fact, it can achieve all odd harmonics rejection if phase mismatch is good enough. As illustrated by FIG. 9, the harmonic-rejection translational filter 400 includes a main path 410, a first harmonic-rejection path 420, a second harmonic-rejection path 430 and a third harmonic-rejection path 440. Each of them includes a translation filter that is driven by local oscillation signals with mutually different phases. A first translation filter 412 included in the main path 410 is driven by the local oscillation signals LOM1-LOM4, a second translation filter 414 included in the first harmonic-rejection path 420 is driven by the local oscillation signals LOH1_1-LOH1_4, a third translation filter 416 included in the second harmonic-rejection path 430 is driven by the local oscillation signals LOH2_1-LOH2_4, and a fourth translation filter 418 included in the third harmonic-rejection path 440 is driven by the local oscillation signals LOH3_1-LOH3_4. The local oscillation signals LOM1-LOM4 LOH1_1-LOH1_4, LOH2_1-LOH2_4 and LOH3_1-LOH3_4 respectively have same frequency at $f_{LO}$ but mutually different phases. For example, the local oscillation signals LOM1-LOM4 could have the phases at 0, 180, 90 and 270 degree, the local oscillation signals LOH1_1-LOH1_4 could have the phases at 45, 225, 135 and 315 degree, the local oscillation signals LOH2_1-LOH2_4 could have the phases at 22.5, 202.5, 112.5 and 292.5 degree and the local oscillation signals LOH3_1-LOH3_4 could have the phases at 67.5, 247.5, 157.5 and 337.5 degree. With such arrangement of LO phases, the harmonic-rejection filter 400 can achieve higher-order harmonic-rejection. Output signals of main path 410 and harmonic-rejection paths 420-440 will be combined by a signal combiner 450 to generate the filtered signal S_Filtered without harmonic-mixing products if there were no mismatch between each path.

A Generalized Form of the Harmonic-Rejection Filter:

As illustrated in FIG. 3A and FIG. 3B, the translation filter of the present invention could be further extended to an N-path filter having N filter branches. The present invention further provides a generalized form of the harmonic-rejection filter based on the N-path filter as shown in FIG. 3A and FIG. 3B.

Figure 10:
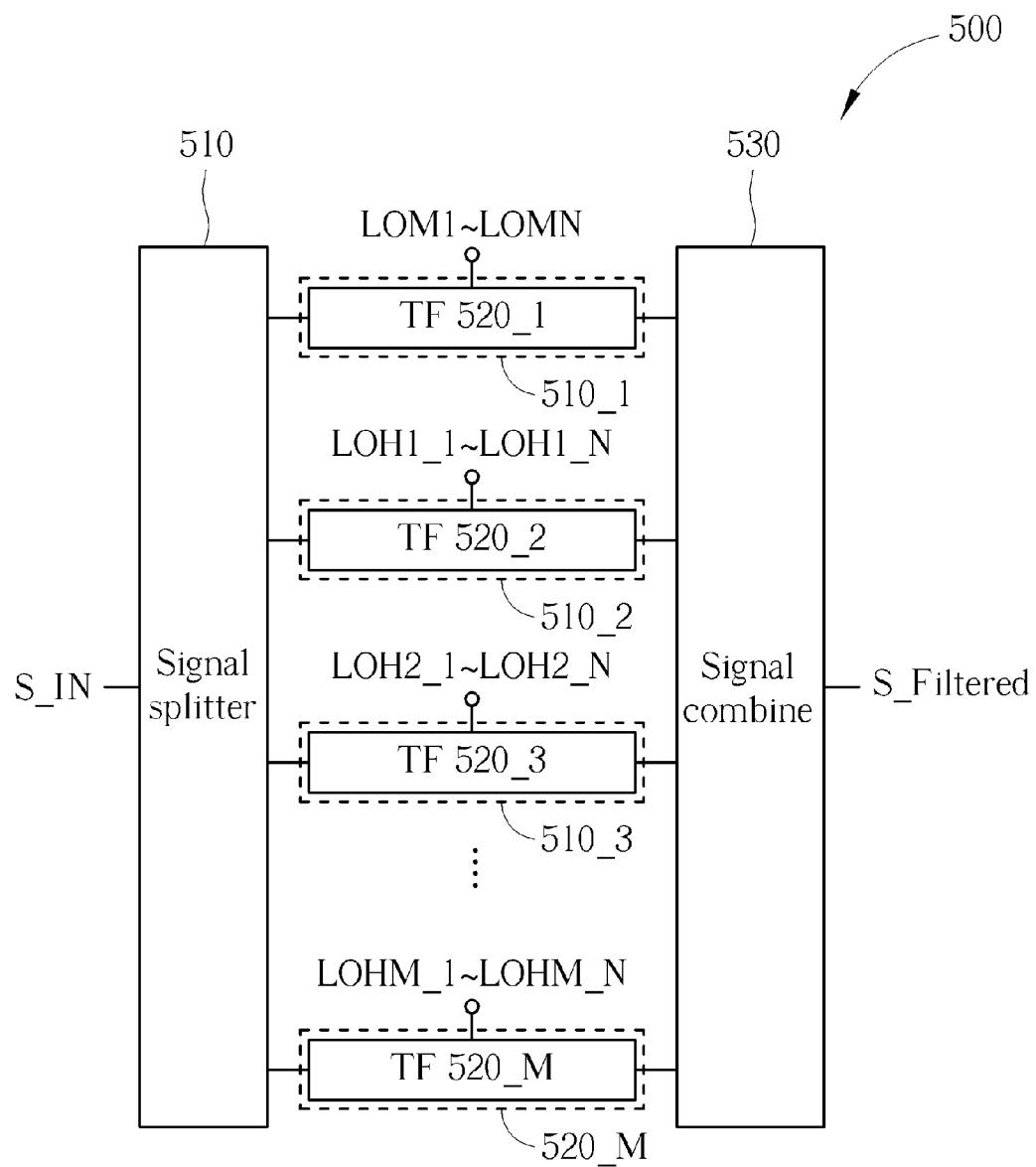
FIG. 10 illustrates a block diagram of a generalized N-phase harmonic-rejection translational filter including M harmonic-rejection paths according to an embodiment of the present invention.

Please refer to FIG. 10, which illustrates a schematic diagram of a generalized form of the harmonic-rejection filter of the present invention according to one embodiment of the present invention. As shown, a generalized harmonic-rejection filter 500 includes multiple paths, a main path 510_1 and multiple harmonic-rejection paths 510_2-510_M. Each path receives an output of a signal splitter 510 that is generated according to an input signal S_IN and can have different weighting (with adjustable passive or active gain units with respect to the paths). A signal combiner 530 combines outputs of all or selected paths to generate a filtered signal S_Filtered by using one signal adder/subtractor or a combination of multiple signal adders and/or signal subtractors, each can also have different weighting. Each of the main path 510_1 and the harmonic-rejection paths 510_2-510_M includes a translational filter that has specific filter branches and corresponding local oscillation frequency and phase. These translational filters are basically identical and each of them has N filter branches. Depending on the input signal S_IN, the translational filter could have architecture as illustrated in FIG. 3A for the input signal S_IN in the single-ended form, or architecture as illustrated in FIG. 3B for the input signal S_IN in the differential form.

Each of filter branches of the translational filter in main path 510_1 and harmonic-rejection paths 510_2-510_M is driven by a local oscillation signal at a specific phase. As mentioned above, phases of the local oscillation signals would be mutually different. Please note that the number "N" may be identical to or different from the number "M". According to which harmonics required to be rejected, different number of paths and LO phase in conjunction with different weighting signal splitter/combiner can be determined to meet the harmonics cancellation criteria. In this embodiments, maximum M*N phases of the LO signals could be utilized for driving these translational filters, each of the LO phases could be equal to (360 degree/(M*N))*n (n is the index of the local oscillation signal). As a result, a reconfigurable high-order harmonic-rejection translational filter can be realized with high flexibilities.

Please note that although only the translational filter is mentioned and included in each path according to above descriptions. The path may further include other components. For example, as there could be gain matches between different paths, at least one of the main path and the harmonic-rejection paths could further include an adjustable gain unit, which can provide different weighting to reduce gain mismatches between different paths.

ADVANTAGEOUS

The harmonic-rejection translational filter of the present invention can be employed in wideband receivers as an on-chip tracking filter without extra high-Q components (e.g. external capacitors or inductors) as it is has good immunity against the harmonic-mixing problem, and preserves all advantages of translational filter. In addition, the harmonic-rejection filter of the present invention preserves all advantages of translational filter (e.g. High-Q and precisely tunable center frequency), and also has the capability to reject all unwanted harmonic-mixing products without paying much penalty of chip size and cost. Hence, the present invention provides an excellent solution to designing a tracking filter in wideband systems for handling components over a wide range of band.

Reference in the specification to "one embodiment" or "an embodiment" means that a particular feature, structure, or characteristic described in connection with the embodiment is included in at least an implementation. The appearances of the phrase "in one embodiment" in various places in the specification are not necessarily all referring to the same embodiment. Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

Those skilled in the art will readily observe that numerous modifications and alterations of the device and method may be made while retaining the teachings of the invention. Accordingly, the above disclosure should be construed as limited only by the metes and bounds of the appended claims.

The invention claimed is:

1. A harmonic-rejection translational filter, comprising:
a first path, having a first translational filter, driven by a plurality of first oscillation signals, arranged to generate a first output signal according to an input signal;
a second path, coupled to the first path, each having a second translational filter that is driven by a plurality of second oscillation signals with phases that are different from phases of the first oscillation signals, arranged to generate a second output signal according to the input signal; and
a signal combiner, coupled to the first path and the second path, arranged to combine the first output signal and the second output signal to generate a filtered signal, wherein harmonic responses caused by the first oscillation signals and the second oscillation signals are substantially reduced from the filtered signal by combining the first output signal and the second output signal.

2. The harmonic-rejection filter of claim 1, wherein the first oscillation signals and the second oscillation signals have a same frequency.

3. The harmonic-rejection filter of claim 1, wherein each of the first translational filter and the second translational filter includes a plurality of filter branches.

4. The harmonic-rejection filter of claim 3, wherein quantity of the filter branches of the first translational filter and quantity of the filter branches of the second translational filter are identical.

5. The harmonic-rejection filter of claim 3, each of the filter branches of the first translational filter and the second translational filter has a first terminal coupled to the input signal, and a second terminal coupled to a ground, and each filter branch comprises:
a switching mixer coupled between the first terminal and an impedance block, driven by one of the first oscillation signals and the second oscillation signals;
wherein the impedance block is coupled between the switching mixer and the ground.

6. The harmonic-rejection filter of claim 3, each of the filter branches of the first translational filter and the second translational filter has a first terminal coupled to the input signal, and a second terminal coupled to another one of the filter branches, and each filter branch comprises:
a switching mixer coupled between the first terminal and an impedance block, driven by one of the first oscillation signals and the second oscillation signals; and
wherein the impedance block is coupled between the switching mixer and another switching mixer of the another one of the filter branches.

7. The harmonic-rejection filter of claim 5, wherein the impedance block comprises at least one capacitor.

8. The harmonic-rejection filter of claim 1, wherein a phase difference between one of the first oscillation signals and one of the second oscillation signals is 45 degree.

9. The harmonic-rejection filter of claim 1, wherein at least one of the first path and the second path further comprises a gain unit.

10. The harmonic-rejection filter of claim 1, wherein the signal combiner comprises at least one signal adder or signal subtractor.

11. The harmonic-rejection filter of claim 1, further comprising:
a plurality of third paths, coupled to the first path and the second path, each having a third translational filter that is driven by a plurality of third oscillation signal, arranged to generate a plurality of third output signals according to the input signal, and the signal combiner combines the first output signal, the second output signal and the third output signals to generate the filtered signal.

12. The harmonic-rejection filter of claim 11, wherein harmonic signals caused by the first oscillation signals, the second oscillation signals and the third oscillation signals, are substantially reduced from the filtered signal by the signal combiner combining the first output signal, the second output signal and the third output signals.

13. The harmonic-rejection filter of claim 1, wherein there is a first phase difference between each two of the first oscillation, and there is a second phase difference between each two of the second oscillation signals; the first phase difference is the same as the second phase difference.

14. The harmonic-rejection filter of claim 13, wherein there is a third phase difference between one of the first oscillation signals and one of the second oscillation signals, and the third phase difference is determined based on the harmonic signals to be suppressed.

* * * * *